United States Patent [19]

Delaye et al.

[11] Patent Number: 4,773,054

[45] Date of Patent: Sep. 20, 1988

[54] MAGNETIC BUBBLE MEMORY WITH A HYBRID JUNCTION

[75] Inventors: Marie-Thérèse Delaye, Grenoble; Jean-Marc Fedeli, Saint Egreve; Joël Magnin, St. Martin; Marc Rabarot, Grenoble, all of France

[73] Assignee: Commissariat a l'Energie Atomique, Paris, France

[21] Appl. No.: 8,181

[22] Filed: Jan. 29, 1987

[30] Foreign Application Priority Data

Feb. 5, 1986 [FR] France .............................. 86 01573

[51] Int. Cl.⁴ ............................................. G11C 19/08
[52] U.S. Cl. ......................................... 365/36; 365/43
[58] Field of Search ........................ 365/36, 15, 16, 43

[56] References Cited

U.S. PATENT DOCUMENTS 4,525,808  6/1985  Kodama et al. ...................... 365/36
4,546,452 10/1985  Suzuki et al. ......................... 365/36

FOREIGN PATENT DOCUMENTS 0081215  6/1983  European Pat. Off. .
0082526  6/1983  European Pat. Off. .
0164082  9/1983  Japan .................................... 365/36

OTHER PUBLICATIONS

Patents Abstracts of Japan, vol. 7, No. 238, 22 Jan. 1983, p. 145, P 231 (Hitachi Seisakusho K. K.).

*Primary Examiner*—James W. Moffitt

[57] ABSTRACT

A bubble memory with a hybrid junction formed between a first propagation track defined by a boundary between an implanted area and a non-implanted area and a second propagation track defined by a sequence of deposited patterns. The overlap zone between the tracks has a surface substantially equal in size to the magnetic bubble. The boundary cleared by the magnetic bubble has a direction perpendicular to an easy magnetization axis of the magnetic material of the memory, and an implanted area is formed beneath one leg of the deposited pattern.

9 Claims, 3 Drawing Sheets

PHASE MARGIN ON
THE POLARIZATION FIELD

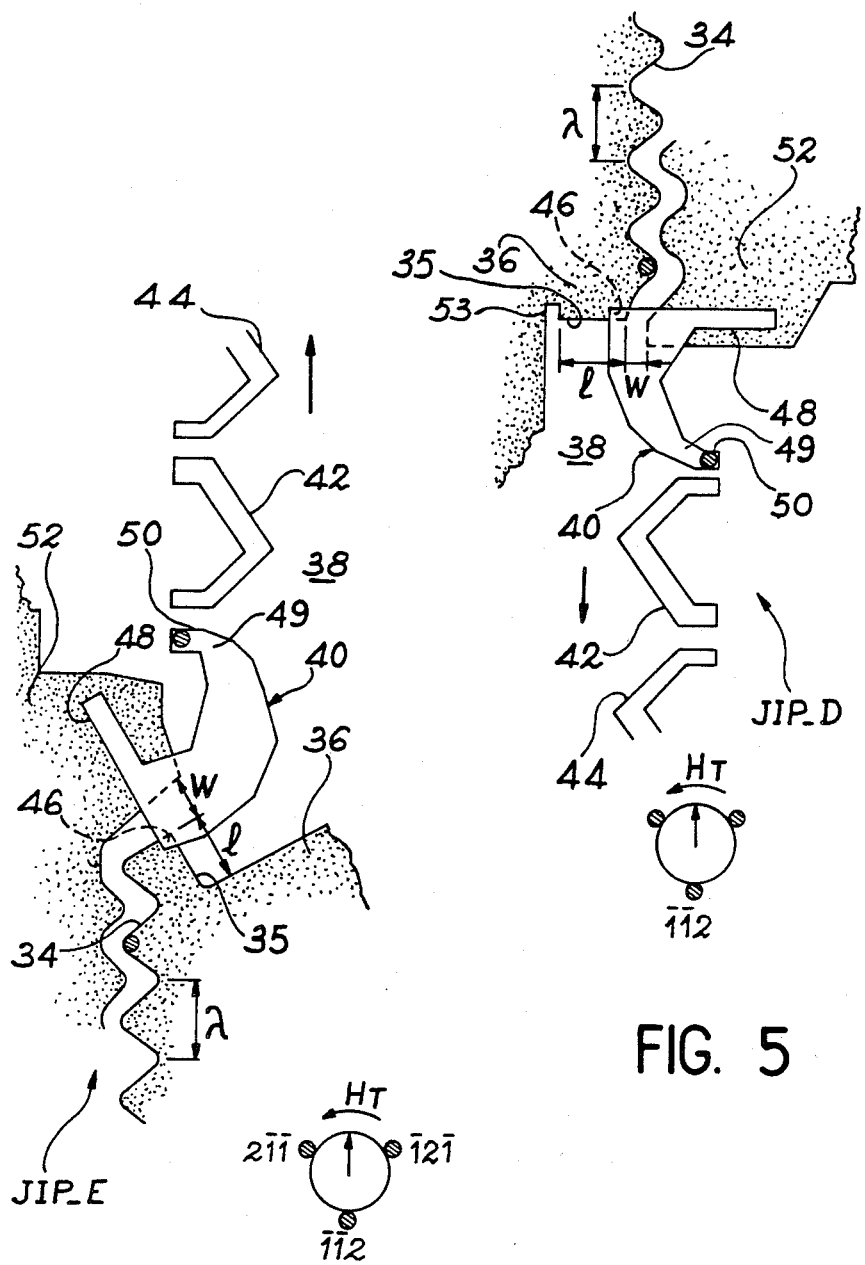

MAGNETIC BUBBLE MEMORY WITH A HYBRID JUNCTION

BACKGROUND OF THE INVENTION

The present invention relates to a magnetic bubble memory with a hybrid junction and more specifically deals with the junction enabling the propagation of a magnetic bubble from an area with non-implanted patterns to an area with deposited patterns. Throughout the remainder of the text such a junction will be designated IP or JIP junction for an implanted permalloy junction.

In a magnetic bubble memory, the magnetic bubbles are contained in a monocrystalline magnetic layer, such as a magnetic garnet film supported by an amagnetic monocrystalline garnet. These bubbles are in the form of generally cylindrical, isolated magnetic regions having a magnetization which is opposite to that of the remainder of the monocrystalline magnetic layer. These magnetic bubbles are stable through the application of a continuous or d.c. magnetic field $H_{pol}$ perpendicular to the plane of the magnetic layer. In practice, this magnetic field is produced by a permanent magnet, which consequently ensures the non-volatility of the informations contained in the bubble memory.

The bubbles are displaced by applying a rotary d.c. field $H_T$ in a direction parallel to the surface of the magnetic layer. The bubbles are displaced around the so-called propagation patterns.

These patterns are in the form of disks, lozenges triangles, T's, etc and can be produced from a material based on iron and nickel, deposited on an insulating layer covering the magnetic layer, or can be obtained by implanting ions in the upper part of the magnetic layer through a mask making it possible to define the shape of these patterns. In the latter case, in view of the fact that ion implantation is only carried out around these patterns, the latter are called non-implanted patterns.

The propagation patterns are generally contiguous and as a result of their shape, two adjacent patterns define two cavities or hollows between them.

The displacement of the bubbles along these patterns generally takes place for a time equal to one third of the rotation period of the planar magnetic field $H_T$, the bubbles remaining stationary in the cavities defined between two adjacent patterns for the remainder of the cycle. These cavities constitute so-called stable positions. Thus, shift registers are produced in which the binary information 1 is represented by the presence of a bubble and the binary information 0 is defined by the absence of a bubble.

Apart from these propagation patterns, it is necessary to use electric conductors for producing within the bubble memory functions such as writing, information recording, non-destructive reading, transfer between registers and erasing.

FIG. 1 diagrammatically shows the known structure of a magnetic bubble memory. It comprises a group of so-called minor loops for storing informations parallel to one another and disposed along an easy magnetization axis $\overline{112}$ of the magnetic material. Each minor loop is connected by an exchange gate $4_1 \ldots 4_n$ to a major writing loop 6 having at one end a magnetic bubble generator 8. The major writing loop 6 is aligned along an axis perpendicular to the axis of the minor loops. Each exchange gate makes it possible to write informations into a minor loop.

Each minor loop is also connected by a duplication gate $10_1 \ldots 10_n$ to a major reading loop 12 parallel to the major writing loop 6. The major reading loop 12 is terminated by a detector 14 constituting a reading means.

A hybrid magnetic bubble memory has two regions 16, 18 with deposited patterns and a region 20 having non-implanted patterns. All the elements of the bubble memory are solely contained in regions 16, 18, with the exception of the minor loops, each of which extends over the three regions. Thus, each minor loop has four junctions JPI-E, JIP-E, JIP-D and JPI-D, which constitute the junctions between the propagation paths or tracks located in the different regions.

The invention relates to junctions enabling a magnetic bubble to pass from a propagation track defined by non-implanted patterns to a propagation track defined by deposited patterns, i.e. junctions JIP-E and JIP-D in FIG. 1.

Such junctions are more particularly described in patent application No. EP-A2-0 081 215, filed on Dec. 3, 1982 by HITACHI. FIGS. 2 and 3 respectively show junctions IP-E and IP-D according to the teaching of said specification.

In each drawing, a first propagation track is defined by a boundary 22 between an implanted area 24 and a non-implanted area 26 and a second propagation track is defined by a sequence of deposited patterns, such as deposited patterns 28, 30. The two propagation tracks have generally parallel directions and overlap at the first deposited pattern 28.

In European application No. 0 081 215 no information is given on the shape or size of the overlap zone, or on the orientation of the boundary between the implanted area and the non-implanted area level with said overlap zone.

However, embodiments of said junction have been described in several other documents.

In the article "Characteristics of junctions between ion-implanted and permalloy tracks in hybrid bubble devices" by N. KODAMA et al, published in IEEE Transactions on Magnetics, vol MAG20, No. 5 (part 1), September 1984, a junction IP-E is shown in FIG. 1. This junction is similar to that shown in FIG. 2, but the boundary between the implanted area and the non-implanted area has a step at overlap zone 32 and then the boundary continues as in FIG. 2.

The author states that this junction is not very reliable. Thus, it has been found that the field margin $H_{pol}$ was difficult to reproduce and that its value could vary between 4 and 10%, as a function of the memories. Moreover, the alignment between technological levels can lead to a deterioration of the margins.

The author proposes an improvement to the junction consisting of replacing the clearly defined boundary between implanted area 24 and non-implanted area 26, where the density of implanted ions passes suddenly from a non-zero value in the implanted area to a zero value in the non-implanted area, by a gentler boundary having a non-zero width where the density of the implanted ions decreases linearly from a non-zero value in the implanted area to a zero value in the non-implanted area.

An IP junction is also described in U.S. Pat. No. 4,546,452 granted on Oct. 8, 1985 to HITACHI. In this junction, the overlap between the two propagation tracks takes place over a length at least equal to 2.5λ, in which λ is the spacing of the non-implanted patterns and said overlap zone is directed along an axis perpendicular to the general direction of the two propagation tracks.

The invention aims at obtaining a reliable IP junction, i.e. having a large, reproducible field margin $H_{pol}$ without having to use a gentle boundary.

In an IP junction, a magnetic bubble passes from a propagation track defined by non-implanted patterns to a propagation track defined by deposited patterns. In the overlap zone of the propagation tracks, it is consequently necessary to have a weak position in the implanted area and a stronger position on the deposited pattern, namely for the phase of the rotary field corresponding to the passage of the magnetic bubble from the first track to the second track.

According to the invention, to obtain a non-stable position in the implanted area at the time of the passage of the magnetic bubble, the boundary between the implanted area and the non-implanted area is oriented perpendicular to an easy magnetization axis of the magnetic material. Moreover, in order to be less sensitive to the alignment between the technological levels defining the two propagation tracks, the overlap zone between the implanted area and the deposited pattern has a surface substantially equal to that of the magnetic bubble.

With regard to the deposited pattern, it is known for the purpose of having a strong position on the pattern deposited level with the overlap zone, to use a pattern having the general shape of a chevron and whereof one leg has a particularly great length and width. According to the invention, it is proposed to increase the magnetic pole created level with the overlap zone by said reinforced arm by forming an implanted area beneath a significant part of said leg. This area has two functions, the first being to limit the width of the non-implanted area in the vicinity of the overlap zone, which reduces the stability of the magnetic bubble on the first propagation track level with said overlap zone, whilst the second function is to force the magnetic bubble towards the end of the other leg of the chevron, whilst in said implanted area the magnetic bubble tends, after extending between the overlap zone and the end of the other leg of the chevron, to return towards the overlap zone if certain technological parameters vary.

SUMMARY OF THE INVENTION

The present invention more specifically relates to a magnetic bubble memory with a hybrid junction comprising a sequence of non-implanted patterns, aligned along an easy magnetization axis of a magnetic material of the memory and defining a first propagation track along the boundary between an implanted area and a non-implanted area, and a sequence of deposited patterns, aligned along the same axis and defining a second propagation track, a junction being formed between said tracks to permit the passage of a magnetic bubble from the first track to the second track, said junction being defined by an overlap of the tracks and wherein the overlap zone between the implanted area and a deposited pattern has a surface substantially equal to the size of a magnetic bubble, the boundary between the implanted area and the non-implanted area cleared by the magnetic bubble when it passes from the first track to the second track being oriented perpendicular to an easy magnetization axis of the magnetic material of the memory, and the first deposited pattern constituting the second propagation track has the general shape of a chevron, whereof the apex coincides with the overlap zone, an implanted area being formed beneath at least a large part of the leg of the chevron located in front of the overlap zone, in accordance with the propagation direction of a magnetic bubble along said deposited pattern.

BRIEF DESCRIPTION OF THE DRAWINGS

The invention is described in greater detail hereinafter relative to non-limitative embodiments and the attached drawings, wherein show:

FIG. 4, diagrammatically an IP-E junction according to the invention.

FIG. 5, diagrammatically an IP-D junction according to the invention.

DETAILED DESCRIPTION OF THE PREFERRED EMBODIMENTS

Figure 1:
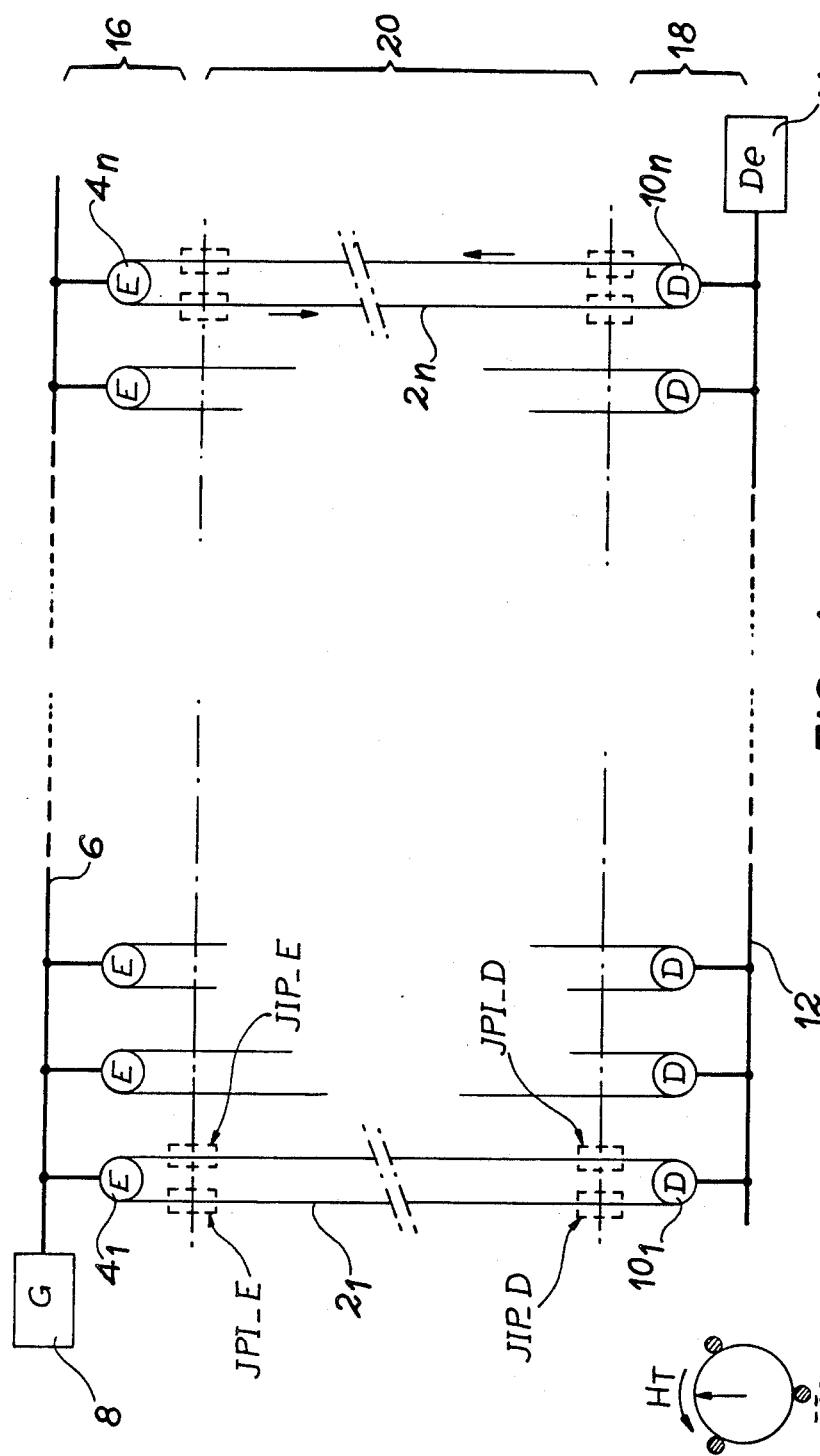
FIG. 1, already described, diagrammatically the conventional structure of a hybrid junction magnetic bubble memory.
Figure 2:
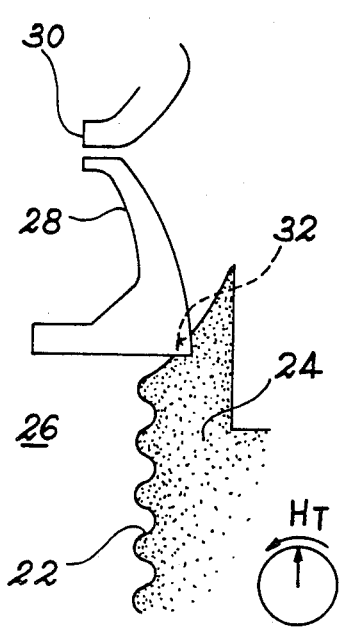
FIG. 2, already described, diagrammatically an IP-E junction level with an exchange gate according to the prior art.
Figure 3:
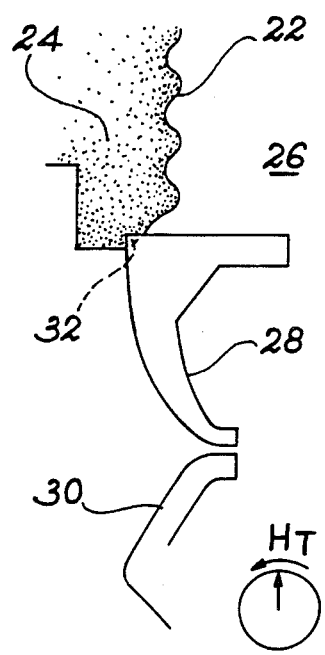
FIG. 3, already described, diagrammatically an IP-D junction level with a duplication gate according to the prior art.

FIG. 4 diagrammatically shows an IP-E junction according to the invention. In this drawing a first propagation path or track is defined by the boundary 34 between an implanted area 36 and a non-implanted area 38, while a second propagation path or track is defined by a sequence of deposited patterns, such as patterns 40, 42 and 44. These two propagation tracks have a generally identical direction parallel to an easy magnetization axis $\overline{112}$ of the magnetic material of the memory.

In known manner, to permit the passage of a magnetic bubble from the first propagation track to the second propagation track, said tracks overlap. According to the invention, the overlap zone 46 between the tracks has a surface substantially equal to the size of a magnetic bubble. This is particularly advantageous because, even in the case of a poor alignment between the technological levels, it has experimentally been found that the surface of the overlap zone remains between 0.5 and 1.5 times the nominal size and that these surface differences do not significantly affect the margin of the field $H_{pol}$ for clearing the magnetic bubble.

As has been stated and as is known, the junction is defined in such a way that the position of the magnetic bubble on the first propagation track in the overlap zone is a weak position for the phase of the rotary field corresponding to the clearing of the magnetic bubble and in such a way that the position of the magnetic bubble on the second propagation track in the overlap zone is a strong position for said phase of the rotary field.

A non-stable position in the implanted area level with the overlap is obtained according to the invention by orienting a portion 35 of boundary 34, which is cleared by the magnetic bubble, in a direction transverse to the easy magnetization axis $\overline{121}$ of the magnetic material of the memory. The length l of said boundary portion 35 must be sufficiently large to ensure that the magnetic bubble does not continue its propagation along the boundary 34 between the implanted area and the non-implanted area. This is obtained by choosing the length l at least equal to the spacing λ between the non-implanted patterns defining the first propagation track.

Moreover, the reinforcement of the stability of the position of the bubble on the second propagation track level with the overlap zone is the result of known characteristics and new characteristics. The modified chevron shape of the deposited pattern 40 constituting the first deposited pattern of the second propagation track shown in FIG. 4 is known. The apex of this chevron coincides with overlap zone 46. This chevron has a large volume and two asymmetrical legs 48,49, leg 48 positioned downstream of the overlap zone 46 with respect to the propagation direction of the magnetic bubbles having an elongated shape to increase the stability of the position of a bubble located at the apex of the chevron in the overlap zone.

This known shape of the first deposited pattern 40 is not always sufficient to permit the propagation of the magnetic bubble on the second propagation track. Thus, it has been found that in certain cases, following stretching between the overlap zone 46 and the end 50 of the other leg 49 of the chevron under the influence of rotary field $H_T$, the magnetic bubble returned to the overlap zone 46 instead of contracting towards the end 50 of the other leg 49 of the chevron in the case of a variation of the technological parameters.

This disadvantage is obviated in the junction according to the invention by the formation of an implanted area 52 extending under at least part of the leg 48 of the deposited pattern 40. When the bubble is stretched between the overlap zone 46 and the end 50 of the other leg 49 of the deposited pattern 40, this implanted area makes it possible to produce a repulsion pole towards the overlap zone 46, in such a way that the bubble is propagated by contracting towards the end 50 rather than towards the overlap zone 46.

In preferred manner, said implanted area 52 extends sufficiently beneath leg 48 to ensure that the width w of the non-implanted area in the vicinity of overlap zone 46 is small, e.g. less than the spacing λ between the non-implanted patterns. This reduction contributes to decreasing the stability of the position of the bubble on the first propagation track in overlap zone 46.

In a magnetic bubble memory with a hybrid junction two types of IP junction are produced on the minor loop. An IP-E junction is located in the vicinity of the exchange gate associated with the minor loop and an IP-D junction is located in the vicinity of the duplication gate associated with said minor loop. The junction shown in FIG. 4 and which has just been described is an IP-E junction.

A description will now be given of an IP-D junction according to the invention with reference to FIG. 5, in which the elements identical to those of FIG. 4 carry the same references.

As shown in FIG. 4, the first propagation track shown in FIG. 5 is defined by the boundary 34 between an implanted area 36 and a non-implanted area 38 and the second propagation track is defined by a sequence of deposited patterns, such as patterns 40, 42 and 44. Preferably, the first deposited pattern 40 has a so-called modified chevron shape and the following patterns have a chevron shape.

The two propagation tracks have a generally identical direction parallel to an easy magnetization axis $\overline{112}$ of the magnetic material of the memory. This axis has an identical direction, but an opposite sense to the propagation axis of the magnetic bubbles of FIG. 4.

In the IP-D junction shown in FIG. 5, the overlap area 46 has the same characteristics (shape, size) as that shown in FIG. 4. As in FIG. 4 and for the same reasons, a portion 35 of the boundary 34 between the implanted area 36 and the non-implanted area 38 which is cleared by the magnetic bubble has a length l, which must at least be equal to the spacing λ between the non-implanted patterns defining the first propagation track. This boundary portion 35 is perpendicular to the easy magnetization axis $\overline{112}$ of the magnetic material of the memory.

However, in FIG. 5, said boundary cleared by the magnetic bubble has a direction perpendicular to the general propagation direction of the bubble, which was not the case in FIG. 4. In this situation, when the magnetic bubble reaches the overlap zone 46, it tends to stretch over the entire length l of the boundary, which can be prejudicial. To prevent this, a non-implanted barrier 53 is located at the end of said boundary of length l. This barrier constitutes a stop limiting the extension of the bubble.

The weakening of the position of the bubble on the first propagation track in the overlap zone and the reinforcing of the position of said bubble on the second propagation track in the overlap zone are obtained in the same way as in the IP-E junction shown in FIG. 4. Thus, the first deposited pattern 40 is preferably a large, chevron-shaped pattern comprising a leg 48 producing a strong pole level with the overlap zone 46.

According to the invention, an implanted area 52 is produced under at least a large part of said leg 48 for further reinforcing the position of the bubble on the second propagation track in the overlap zone. By limiting the width w of the non-implanted area in the vicinity of said overlap zone, said implanted area 52 also contributes to the weakening of the position of the bubble on the first propagation track.

Finally, the implanted area 52 makes it possible to force the magnetic bubble towards the end 50 of the deposited pattern 40 after said bubble has cleared the boundary between the implanted area 36 and the non-implanted area 38.

Figure 6:
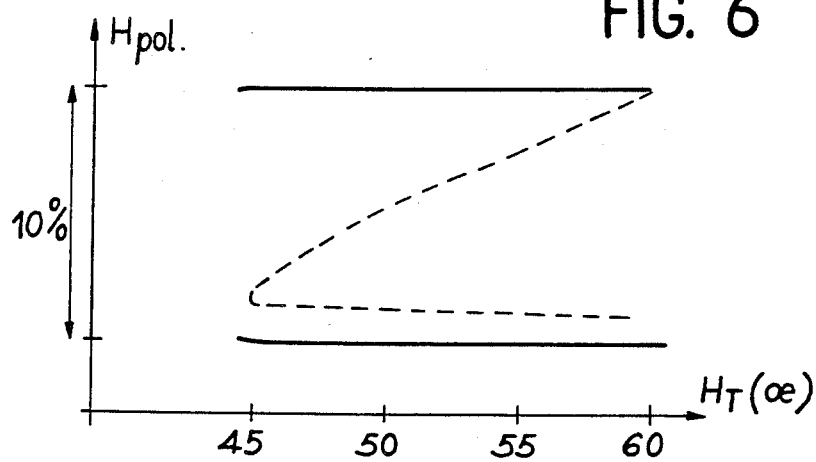
FIG. 6, a graph showing the phase margin of the rotary field at the time of passage of a magnetic bubble from the first propagation track to the second propagation track for a prior art junction and for a junction according to the invention.

The IP junction according to the invention makes it possible to significantly improve the field margin $H_{pol}$ during the clearing by the magnetic bubble of the boundary between the implanted area and the non-implanted area. This can be clearly gathered from the graph of FIG. 6, where the margin $H_{pol}$ is shown as a function of the value of rotary field $H_T$. There is a first, broken line curve defining the field margin $H_{pol}$ for a known junction, said field margin $H_{pol}$ being between 0% for a field $H_T$ of 45 Oersted and approximately 9% for a field of at least 60 Oersted.

The field margin $H_{pol}$ for a junction according to the invention is shown by two continuous lines. This field margin $H_{pol}$ is constant and approximately 10%, no matter what the value of the field between 45 and 60 Oersted. Thus, the junction according to the invention makes it possible to obtain a field margin $H_{pol}$ which is much larger than in known junctions.

What is claimed is:

1. A magnetic bubble memory comprising: a sequence of non-implanted patterns aligned along an easy magnetization axis of a magnetic material of the memory and defining a first propagation track along a boundary between an implanted area and a non-implanted area; a sequence of deposited patterns aligned along the same axis and defining a second propagation track; and a junction forming an overlap zone between said tracks to permit passage of a magnetic bubble from said first track to said second track and having a surface substantially equal in size to a magnetic bubble; the boundary having a portion at said junction cleared by the magnetic bubble which is oriented transversely to said easy magnetization axis, one of said deposited patterns constituting part of the second propagation track having generally the shape of a chevron, with an apex which coincides with the overlap zone, and with a leg having at least a part thereof above an implanted area of said boundary and located downstream of the overlap zone with respect to the propagation direction of a magnetic bubble along the deposited pattern.

2. A magnetic bubble memory according to claim 1, wherein said boundary portion has a length at least equal to the spacing $\lambda$ of the non-implanted patterns defining the first propagation track.

3. A magnetic bubble memory according to claim 1, wherein the implanted area located beneath the leg of the chevron extends up to a width w from the overlap zone.

4. A magnetic bubble memory according to claim 3, wherein the width w is less than the spacing $\lambda$ of the non-implanted patterns.

5. A magnetic bubble memory comprising: a sequence of non-implanted patterns aligned along an easy magnetization axis of a magnetic material of the memory and defining a first propagation track along a boundary between an implanted area and a non-implanted area; a sequence of deposited patterns aligned along the same axis and defining a second propagation track; and a junction forming an overlap zone between said tracks to permit passage of a magnetic bubble from said first track to said second track and having a surface substantially equal in size to a magnetic bubble; the boundary having a portion at said junction cleared by the magnetic bubble which is oriented transversely to said easy magnetization axis, one of said deposited patterns constituting part of the second propagation track having generally the shape of a chevron, with an apex which coincides with the overlap zone, and with a leg having at least a part thereof above an implanted area of said boundary and located level with the overlap zone with respect to the propagation direction of a magnetic bubble along the deposited pattern.

6. A magnetic bubble memory according to claim 5, in which said portion of said boundary between the implanted area and the non-implanted area is oriented perpendicularly to the propagation direction and wherein said portion of said boundary is terminated by a non-implanted barrier preventing extension of the bubble along said boundary portion.

7. A magnetic bubble memory according to claim 5, wherein said boundary portion has a length at least equal to the spacing $\lambda$ of the non-implanted patterns defining the first propagation track.

8. A magnetic bubble memory according to claim 5, wherein the implanted area located beneath the leg of the chevron extends up to a width w from the overlap zone.

9. A magnetic bubble memory according to claim 8, wherein the width w is less than the spacing $\lambda$ of the non-implanted patterns.

* * * * *